United States Patent
Ishii (10) Patent No.: US 10,329,658 B2
(45) Date of Patent: Jun. 25, 2019

(54) GAS BARRIER LAMINATE AND METHOD FOR PRODUCING THE GAS BARRIER LAMINATE

(71) Applicant: Toppan Printing Co., Ltd., Taito-ku, Tokyo (JP)

(72) Inventor: Toshiya Ishii, Tokyo (JP)

(73) Assignee: TOPPAN PRINTING CO., LTD., Tokyo (JP)

(*) Notice: Subject to any disclaimer, the term of this patent is extended or adjusted under 35 U.S.C. 154(b) by 730 days.

(21) Appl. No.: 14/867,711

(22) Filed: Sep. 28, 2015

(65) Prior Publication Data

US 2016/0017479 A1 Jan. 21, 2016

Related U.S. Application Data

(63) Continuation of application No. PCT/JP2014/059236, filed on Mar. 28, 2014.

(30) Foreign Application Priority Data

Mar. 29, 2013 (JP) ................ 2013-072943
Sep. 12, 2013 (JP) ................ 2013-189337

(51) Int. Cl.
| | |
|---|---|
| *B32B 27/08* | (2006.01) |
| *B32B 27/00* | (2006.01) |
| *B32B 9/04* | (2006.01) |
| *C23C 14/08* | (2006.01) |
| *C08J 7/04* | (2006.01) |
| *C08J 5/18* | (2006.01) |
| *C23C 14/02* | (2006.01) |
| *C23C 14/30* | (2006.01) |
| *C08J 3/28* | (2006.01) |

(52) U.S. Cl.
CPC .......... *C23C 14/081* (2013.01); *C08J 3/28* (2013.01); *C08J 5/18* (2013.01); *C08J 7/042* (2013.01); *C08J 7/045* (2013.01); *C23C 14/022* (2013.01); *C23C 14/024* (2013.01); *C23C 14/30* (2013.01); *C08J 2323/12* (2013.01); *C08J 2475/04* (2013.01)

(58) Field of Classification Search
CPC ... C23C 14/081; C23C 14/022; C23C 14/024; C23C 14/30; C08J 2323/12; C08J 5/18
USPC .......... 428/515, 500, 411.1, 336, 424.8, 483, 428/522, 523; 427/248.1, 307
See application file for complete search history.

(56) References Cited

U.S. PATENT DOCUMENTS

| | | | |
|---|---|---|---|
| 3,442,686 A | 5/1969 | Jones | |
| 5,324,467 A | 6/1994 | Anderson, II | |
| 2010/0015431 A1* | 1/2010 | Matsui | B29C 66/72324 428/323 |

FOREIGN PATENT DOCUMENTS

| | | | |
|---|---|---|---|
| JP | 61-225049 A | | 10/1986 |
| JP | S63-028017 B2 | | 6/1988 |
| JP | 2001-253005 | * | 9/2001 |
| JP | 2001-253005 A | | 9/2001 |
| JP | 2002-144503 | * | 5/2002 |
| JP | 2002-144503 A | | 5/2002 |
| JP | 2007-196550 A | | 8/2007 |
| JP | 2007-301878 | * | 11/2007 |
| JP | 2007-301878 A | | 11/2007 |
| JP | 2009-079170 A | | 4/2009 |
| JP | 2009-184252 A | | 8/2009 |
| JP | 2011-012126 A | | 1/2011 |
| JP | 2012-206381 A | | 10/2012 |

OTHER PUBLICATIONS

Tsuyumoto et al, JP 2001-253005 Machine Translation, Sep. 18, 2001 (Year: 2001).*
Tanaka et al, JP 2002-144503 Machine Translation, May 21, 2002 (Year: 2002).*
Imai et al, JP 2007-301878 Machine Translation, Nov. 22, 2007 (Year: 2007).*
Japanese Office Action dated Dec. 5, 2017 in corresponding application No. 2015-508780.
Office Action dated Apr. 13, 2017 in Taiwanese Patent Application No. 103111616.
International Search Report dated Jul. 1, 2014 in PCT/JP2014/059236.

* cited by examiner

*Primary Examiner* — Jessica Whiteley
(74) *Attorney, Agent, or Firm* — Foley & Lardner LLP (57) ABSTRACT

A gas barrier laminate of the present invention includes a biaxially-oriented polypropylene base and an aluminum oxide thin film formed on one surface of the biaxially-oriented polypropylene base. The biaxially-oriented polypropylene base has a plane orientation factor ΔP ranging from 0.005 to 0.020 according to phase-contrast measurement. Further, the gas barrier laminate of the present invention includes a biaxially-oriented polypropylene base and an aluminum oxide thin film formed on one surface of the biaxially-oriented polypropylene base. The biaxially-oriented polypropylene base has a molecular chain whose orientation angle measured by phase-contrast measurement ranges from 50° to 90° or from −50° to −90° relative to an MD direction.

7 Claims, 3 Drawing Sheets

GAS BARRIER LAMINATE AND METHOD FOR PRODUCING THE GAS BARRIER LAMINATE

CROSS-REFERENCE TO RELATED PATENT APPLICATIONS

This application is a continuation application filed under 35 U.S.C. 111(a) claiming the benefit under 35 U.S.C. §§ 120 and 365(c) of PCT International Application No. PCT/JP2014/059236 filed on Mar. 28, 2014, which is based upon and claims the benefit of priority of Japanese Application No. 2013-072943 filed on Mar. 29, 2013, and Japanese Application No. 2013-189337, filed on Sep. 12, 2013, the entire contents of all of which are hereby incorporated by reference in their entireties.

BACKGROUND

The present invention relates to a gas barrier laminate using a biaxially-oriented polypropylene film (hereinafter referred to as an OPP film) base, and a method for producing the gas barrier laminate.

Packaging materials used for packaging food products, non-food products, or pharmaceutical products are required to prevent degradation of the products and retain the functions and nature of the products. To this end, the packaging materials are required to have impermeability to oxygen, moisture, and other gases that degrade the products. As such packaging materials, gas barrier laminates are well known.

Such gas barrier laminates generally use metal foils such as of aluminum as gas barrier layers. Gas barrier layers such as of aluminum foils are unlikely to be influenced by temperature/humidity changes or the like. It is true that the packaging materials using metal foils such as of aluminum are unlikely to be influenced by temperature/humidity changes and thus have good gas barrier properties. However, such packaging materials have problems, for example, that the products cannot be seen and recognized through the packaging materials, or the packaging materials have to be treated as incombustible materials when discarded after use, or metal detectors cannot be used for searching the packaging materials.

Packaging materials for overcoming these problems are under development. For example, using a forming method, such as vacuum deposition or sputtering, a vapor-deposited film of an inorganic oxide, such as silicon oxide or aluminum oxide, is formed on a polymer film, for use as a packaging material (e.g., see PTLs 1 and 2). Such vapor-deposited films are known as having transparency and properties for blocking gases, such as moisture. Further, the vapor-deposited films have an effect of improving adhesiveness relative to a laminated film and thus are favorable as packaging materials having transparency and gas barrier properties which cannot be achieved by metal foils, or the like.

PATENT LITERATURE

PLT 1: U.S. Pat. No. 3,442,686
PLT 2: JP-B-S63-028017

SUMMARY OF THE INVENTION

Some conventional gas barrier laminates are configured by simply laminating aluminum oxide on a film base. Such a configuration exerts only poor adhesiveness between the base and the aluminum oxide thin film and thus raises a problem of causing delamination when subjected to heat sterilization treatment, such as boiling/retort treatment. Further, some conventional gas barrier laminates are configured by laminating aluminum oxide on a base including a film whose plane orientation factor is not adjusted. Such a configuration also exerts poor adhesiveness between the base and the aluminum oxide thin film and thus again raises a problem of causing delamination when subjected to heat sterilization treatment, such as boil/retort treatment. As factors causing such a problem, mention can be made of separation between the base and the aluminum oxide thin film (factor 1), and base separation occurring on a base surface (factor 2). To cope with the factor 1, an anchor coating may be applied to the base surface, for the improvement of the adhesiveness between the base and the aluminum oxide thin film to thereby suppress degradation to some extent. However, when degradation separation takes place on a base surface as in the factor 2, there is a problem of not being able to suppress degradation well.

In particular, oriented polypropylene (OPP) films have moisture barrier properties inferior to those of polyethylene terephthalate (PET) films. Therefore, when used solely, such an OPP film does not have an effect of preventing permeation of gases. Further, since the breaking strength of the OPP films is insufficient, the problems as mentioned above tend to be caused.

The present invention has been made in light of the problems set forth above and has as its object to provide a gas barrier laminate which is better able to retain adhesiveness of an aluminum oxide thin film relative to an OPP film when subjected to boiling/retort treatment, and to provide a method for producing the gas barrier laminate.

A gas barrier laminate of a first aspect of the present invention includes a biaxially-oriented polypropylene base; and an aluminum oxide thin film formed on one surface of the biaxially-oriented polypropylene base, wherein: the biaxially-oriented polypropylene base has a plane orientation factor $\Delta P$ ranging from about 0.005 to about 0.020 according to phase-contrast measurement.

In the gas barrier laminate of the first aspect of the present invention, it is preferable that the aluminum oxide thin film has a ratio of oxygen and aluminum (O/Al) ranging from about 1.0 to about 1.5 as calculated by X-ray photoelectron spectroscopy.

In the gas barrier laminate of the first aspect of the present invention, it is preferable that the biaxially-oriented polypropylene base is provided, on one surface thereof, with an anchor coat layer.

In the gas barrier laminate of the first representative aspect of the present invention, it is preferable that the anchor coat layer is selected from a polyester resin, a urethane resin, an acrylic resin, and an oxazoline group-containing resin.

In the gas barrier laminate of the first aspect of the present invention, it is preferable that the biaxially-oriented polypropylene base is provided, on one surface thereof, with a surface-treated layer formed by discharge treatment.

A gas barrier laminate of a second representative aspect of the present invention includes a base formed of a biaxially-oriented polypropylene film; and an aluminum oxide thin film formed at least on one surface of the base, wherein: the biaxially-oriented polypropylene film has a molecular chain whose orientation angle measured by phase-contrast measurement ranges from 50° to 90° or from −50° to −90° relative to an MD direction (machine direction).

In the gas barrier laminate of the second aspect of the present invention, it is preferable that the biaxially-oriented polypropylene film has a plane orientation factor ΔP ranging from about 0.005 to about 0.020 according to phase-contrast measurement.

In the gas barrier laminate of the second aspect of the present invention, it is preferable that the aluminum oxide thin film shows a ratio of oxygen and aluminum (O/Al) ranging from about 1.0 to about 1.5 as calculated by X-ray photoelectron spectroscopy.

In the gas barrier laminate of the second aspect of the present invention, it is preferable that the aluminum oxide thin film has a thickness of about 10 to about 300 nm.

In the gas barrier laminate of the second aspect of the present invention, it is preferable that the base and the aluminum oxide thin film have interposed therebetween an anchor coat layer.

In the gas barrier laminate of the second aspect of the present invention, it is preferable that the anchor coat layer uses a material selected from a polyester resin, a urethane resin, an acrylic resin, and an oxazoline group-containing resin.

In the gas barrier laminate of the second aspect of the present invention, it is preferable that the base is provided, on one surface thereof, with a surface-treated layer formed by discharge treatment.

A method for producing a gas barrier laminate of a third representative aspect of the present invention includes selecting as a base a biaxially-oriented polypropylene film having a molecular chain whose orientation angle measured by phase-contrast measurement ranges about from 50° to 90° or from −50° to −90° relative to an MD direction; and laminating an aluminum oxide thin film at least on one surface of the base.

A method for producing a gas barrier laminate of a fourth aspect of the present invention includes selecting as a base a biaxially-oriented polypropylene film having a plane orientation factor ΔP ranging from about 0.005 to about 0.020 according to phase-contrast measurement; and laminating an aluminum oxide thin film at least on one surface of the base.

The inventor of the present invention investigated lowering of adhesiveness in a conventional gas barrier laminate in which an aluminum oxide thin film is laminated on a base made of a resin film. As a result of the researches, it was found that the lowering of a cohesive force on the surface of the film base on which the aluminum oxide thin film was laminated, was the cause of the lowering of the adhesiveness between the base and the aluminum oxide thin film.

Based on the results of the researches, the inventor of the present invention found that the plane orientation factor ΔP of the OPP base was associated with adhesion strength, through formation of an aluminum oxide thin film on one surface of a biaxially-oriented polypropylene (OPP) base. The plane orientation factor ΔP refers to a degree of arraying when molecules are horizontally arrayed relative to the plane of a film that has been retained at an appropriate heat setting temperature after biaxial orientation. The plane orientation factor ΔP is calculated by phase-contrast measurement.

Specifically, according to the first aspect of the present invention, the plane orientation factor ΔP of the OPP base according to phase-contrast measurement falls within a range of about 0.005 to about 0.020. With this range, adhesiveness relative to the aluminum oxide thin film laminated on the base can be improved. Moreover, the adhesiveness can well ensure endurance against boiling/retort treatment.

According to the first aspect of the present invention, the aluminum oxide thin film shows a ratio of oxygen and aluminum (O/Al) ranging from about 1.0 to about 1.5 as calculated by X-ray photoelectron spectroscopy. With this range, gas barrier properties exerting excellent transparency and adhesiveness can be provided.

According to the first aspect of the present invention, the OPP base is provided, on one surface thereof with, an anchor coat layer. With this configuration, adhesiveness between the OPP base and an aluminum oxide thin film can be further improved.

According to the first aspect of the present invention, the anchor coat layer is selected from a polyester resin, a urethane resin, an acrylic resin, and an oxazoline group-containing resin. With this selection, affinity between the OPP base and the anchor coat layer is increased to thereby improve adhesiveness more.

According to the first aspect of the present invention, a reactive ion etching treatment is applied to one surface of the OPP base. Giving discharge treatment, such as reactive ion etching treatment, a treated layer as an active layer can be formed quite near a surface of the OPP base. Further, by applying such treatment, impurities can be removed from the surface, and further, the surface can be properly roughened, thereby further improving adhesiveness between the OPP base and the aluminum oxide thin film.

According to the first aspect of the present invention, at least one gas among argon, nitrogen, oxygen and hydrogen is used to more effectively form an active layer and more effectively perform surface cleaning.

As mentioned above, the present invention provides a gas barrier laminate which is able to retain adhesiveness of an aluminum oxide thin film relative to an OPP base when subjected to boiling/retort treatment, whereas transparent gas barrier laminates based on conventional art formed of OPP bases have been insufficient in durability.

The second and third aspects of the present invention provide a gas barrier laminate which is able to retain adhesiveness of an aluminum oxide thin film relative to an OPP base when subjected to boiling/retort treatment, and provide a method for producing the gas barrier laminate.

DETAILED DESCRIPTION

Hereinafter will be described in detail a gas barrier laminate and a method for producing the gas barrier laminate, related to some representative embodiments of the present invention. However, it is understood that the present invention is not limited to these representative embodiments.

In the drawings to be referred to in the following description, the scale of individual component members is appropriately changed to show each of the component members in an easily recognizable size.

First Embodiment

Figure 1:
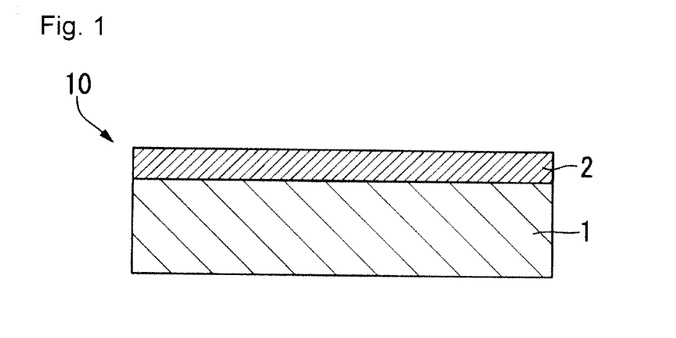
FIG. 1 is a cross-sectional view illustrating a first embodiment of a gas barrier laminate related to the present invention.

FIG. 1 is a cross-sectional view illustrating a representative first embodiment of a gas barrier laminate related to the present invention. As shown in FIG. 1, in the first embodiment of the present invention, a gas barrier laminate 10 is provided by forming an aluminum oxide thin film 2 on one surface (first surface) of an OPP base 1 (a base formed of a biaxially-oriented polypropylene (OPP) film). The OPP base has a plane orientation factor ΔP ranging from about 0.005 to about 0.020 according to phase-contrast measurement.

Figure 2A:
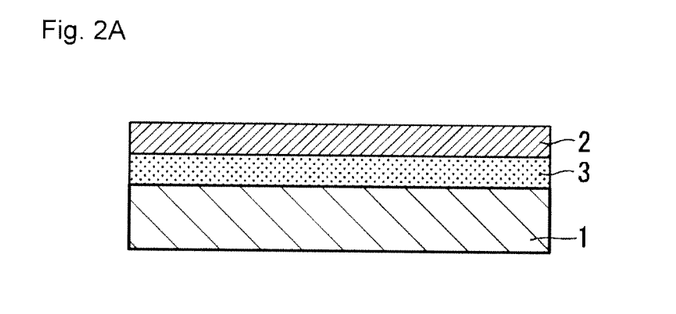
FIG. 2A is a cross-sectional view illustrating a modification of the first embodiment of the gas barrier laminate related to the present invention.
Figure 2B:
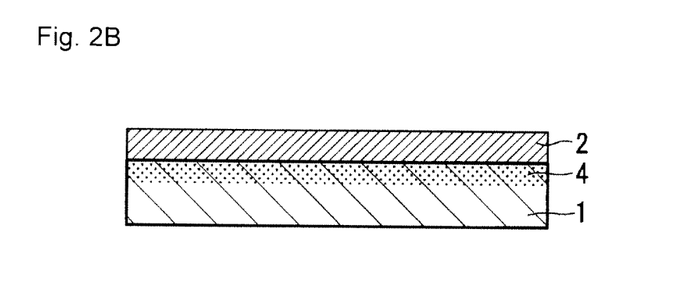
FIG. 2B is a cross-sectional view illustrating a modification of the first embodiment of the gas barrier laminate related to the present invention.

FIGS. 2A and 2B are cross-sectional views each illustrating a modification of the first embodiment of the gas barrier laminate 10 related to the present invention. In the first embodiment of the present invention, an anchor layer 3 as shown in FIG. 2A may be provided on one surface of the OPP base 1 having a plane orientation factor ΔP ranging from about 0.005 to about 0.020 according to phase-contrast measurement, and then the aluminum oxide thin film 2 may be formed on the anchor layer 3. Alternatively, as shown in FIG. 2B, the OPP base 1 may be subjected to discharge treatment, such as reactive ion etching (RIE) treatment described later, to provide a surface-treated layer 4, followed by forming an aluminum oxide thin film 2 on the surface-treated layer 4.

The plane orientation factor ΔP can be calculated using such a method as phase-contrast measurement or Abbe refractometry. However, in the case of using the Abbe refractometry, measured values vary depending on the persons who take measurements. On the other hand, phase-contrast measurement ensures stable measurement, irrespective of the persons who take measurements, or hardly causes variations depending on the persons who take measurements. Moreover, phase-contrast measurement enables correct calculation of the plane orientation factor ΔP. For this reason, it is favorable to use phase-contrast measurement in measuring the plane orientation factor ΔP.

As the OPP base 1 according to the first embodiment of the present invention, an oriented base is used which has a high mechanical strength and excellent dimensional stability. In a method of adjusting the plane orientation factor ΔP to a range of about 0.005 to about 0.020, for example, a base is subjected to biaxial orientation, followed by heat setting. Specifically, the plane orientation factor ΔP can be controlled by appropriately selecting the conditions of biaxial orientation and heat setting. More specifically, for example, the plane orientation factor ΔP can be adjusted to a desirable range by performing biaxial orientation, followed by heat setting over a long duration of time at a low temperature. Alternatively, performing surface treatment, such as reactive ion etching (RIE) treatment described later, the surface can be reformed such that the plane orientation factor ΔP falls in the range of about 0.005 to about 0.020. The OPP base 1 to be used may be one whose plane orientation factor ΔP has been adjusted in advance to the range of about 0.005 to about 0.020 as described above by an OPP base maker, or reforming treatment may be given to the surface of the OPP base 1 immediately before forming the aluminum oxide thin film 2.

The thickness of the OPP base 1 is not particularly limited, but an extremely small thickness may cause wrinkling or breakage of film in forming the aluminum oxide thin film by means of a take-up device. On the other hand, an excessively large thickness may impair the flexibility of the film, causing difficulty in processing the film by means of a take-up device. Therefore, favorably, the thickness of the OPP base 1 is about 3 to about 200 μm, and more favorably, 6 to 50 μm. By setting the thickness of the OPP base 1 to this range, an aluminum oxide thin film can be formed on the base 1 by means of a take-up device without causing any inconvenience.

It is preferable that the aluminum oxide thin film 2 of the first embodiment of the present invention has a specific value of the ratio of oxygen and aluminum (O/Al ratio) as calculated by an XPS measurement. An excessively small O/Al ratio does not ensure good barrier properties and, moreover, may cause coloring which impairs transparency, easily allowing film defect, such as a cracks, to occur. As a result, the barrier properties of the gas barrier laminate 10 including the aluminum oxide thin film 2 may be impaired, and also the adhesiveness between the aluminum oxide thin film 2 and the OPP base 1 may be impaired. With the O/Al ratio is specified to a range of about 1.0 to about 1.5, the aluminum oxide thin film 2 has transparency and high adhesiveness relative to the base 1.

Further, it is favorable that the aluminum oxide thin film 2 has an appropriate thickness. An excessively small thickness of the aluminum oxide thin film 2 disables formation of a uniform film and involves difficulty in well achieving the function as a gas barrier material. On the other hand, an excessively large thickness of the aluminum oxide thin film 2 may disable retention of flexibility due to residual stress and thus may cause cracking due to external factors after film formation. With the thickness being specified to a range of about 5 to about 300 nm, the aluminum oxide thin film 2 can make uniform the film thickness and exhibit flexibility appropriate as a gas barrier material. A more preferable range of the thickness of the aluminum oxide thin film 2 is 10 to 300 nm.

To improve density as well as adhesiveness between the OPP base and the aluminum oxide thin film 2, the aluminum oxide thin film 2 may be vapor-deposited by using a plasma assisted method or an ion beam assisted method. By performing vapor deposition while blowing various gases, such as oxygen (reactive vapor deposition), transparency of the vapor-deposited aluminum oxide thin film can be more enhanced.

The gas barrier laminate 10 according to the first embodiment of the present invention may have a structure in which a primer layer is formed on a surface of the OPP base 1 and the aluminum oxide thin film 2 is provided on the primer layer to improve adhesiveness. For example, as shown in FIG. 2A, the anchor coat layer 3 may be formed as the primer layer. Alternatively, as shown in FIG. 2B, plasma treatment, such as RIE treatment, may be given to the surface layer of the OPP base 1 to form the surface-treated layer 4 as the primer layer.

The anchor coat layer 3 can be formed by coating an anchor coating agent onto a surface of the OPP base 1, followed by drying. Coating of the anchor coating agent onto a surface of the OPP base 1 can not only enhance adhesiveness between the OPP base 1 and the aluminum oxide thin film 2, but also, owing to the leveling effect, improve flatness of the surface on which the aluminum oxide thin film 2 is formed. Accordingly, applying the anchor coating agent enables formation of a uniform aluminum oxide thin film having fewer film defects, such as cracks. It is preferable that the anchor coating agent is selected, for example, from solvent-soluble or water-soluble polyester resins, isocyanate resins, urethane resins, acrylic resins, vinyl alcohol resins, ethylene vinyl alcohol resins, vinyl-modified resins, epoxy resins, oxazoline group-containing resins, modified styrene resins, modified silicone resins, or alkyl titanate, or the like. These may be used singly or in combination of two or more.

Further, the thickness of the anchor coat layer 3 is preferably about 5 nm to 5 μm, more preferably 10 nm to 1 μm. The thickness in this range enables formation of a uniform layer on the OPP base 1, with the internal stress being suppressed. To improve coating properties and adhesiveness of the anchor coat layer 3, the surface of the OPP base 1 may be subjected to discharge treatment prior to forming the anchor coat layer.

On the other hand, the surface-treated layer 4 may be formed through discharge treatment, such as corona treatment or RIE treatment. Radicals or ions generated in plasma can be used for imparting a functional group to the surface of the OPP base 1, thereby achieving a chemical effect of improving adhesiveness. Ion etching can remove impurities from the surface of the OPP base 1, while increasing surface roughness, thereby achieving a physical effect of improving adhesiveness. This is because plasma treatment can introduce a functional group onto the surface of the OPP base 1 and causes the surface of the OPP base and alumina to interact with each other (hydrogen bond: C—OH . . . Al). In the case of forming the anchor coat layer 3 as well, a hydrogen bond takes place between the hydroxyl group in the anchor coat layer and the surface of the OPP base, thereby contributing to improving adhesiveness. As a result, adhesiveness is further improved between the OPP base 1 and the aluminum oxide thin film 2. Accordingly, durability is obtained which is sufficient for preventing peeling between the OPP base 1 and the aluminum oxide thin film 2 in boiling/retort treatment as well.

Figure 3:
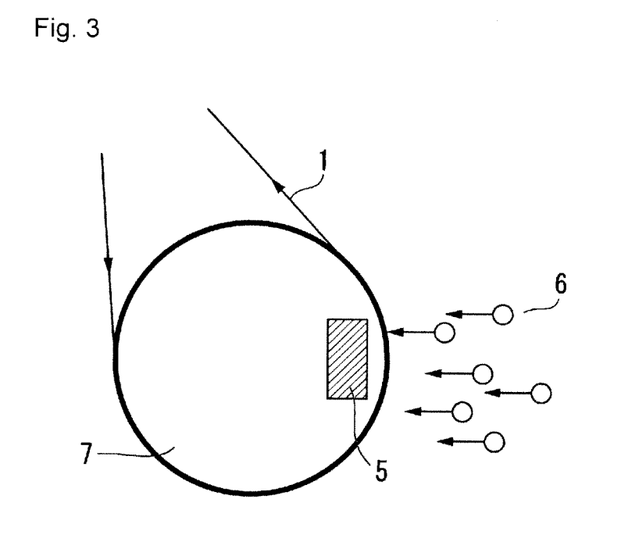
FIG. 3 is a schematic diagram illustrating a process of performing reactive ion etching (RIE) using a planar plasma treatment device.

Further, discharge treatment also has an effect of adjusting the plane orientation factor ΔP of the OPP base 1 to a more proper value. Discharge treatment is not particularly limited but RIE treatment is preferable. RIE treatment can be performed by using a take-up type in-line device, and thus can use a planar-type treatment device which applies a voltage to a cooling drum on which the OPP base 1 is placed. For example, in a method of applying RIE treatment to the OPP base 1 using the planar-type treatment device shown in FIG. 3, an electrode 5 (negative electrode) is arranged inside a treatment roll 7 (cooling roll). With this arrangement, the OPP base 1 is conveyed over the treatment roll 7, while ions in the plasma 6 are permitted to react with the surface of the OPP base 1 to thereby perform RIE treatment. According to such a method, the OPP base 1 can be located at a position near the negative electrode (cathode) and thus high self-bias can be achieved for conducting RIE treatment.

Figure 4:
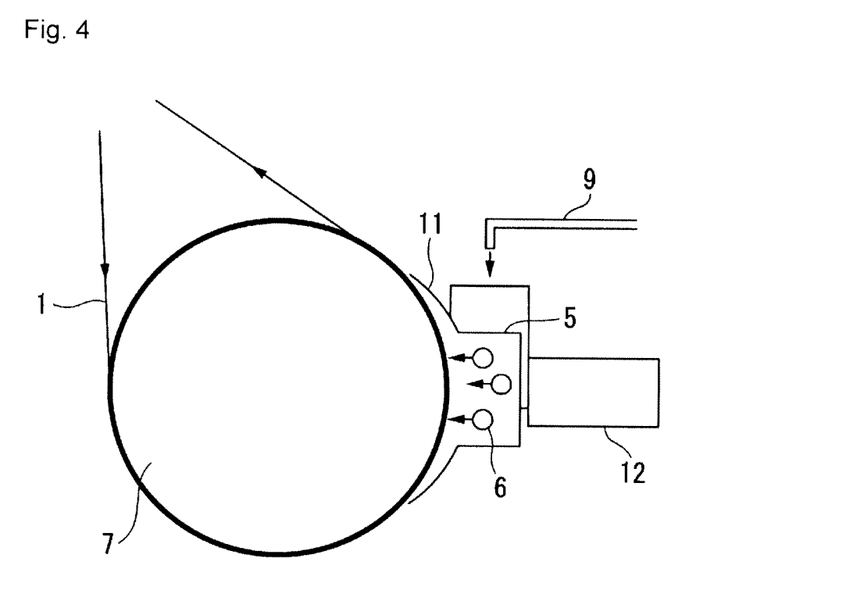
FIG. 4 is a schematic diagram illustrating a process of performing reactive ion etching (RIE) using a hollow anode plasma treatment device.

Further, RIE treatment can be given using a hollow anode plasma treatment device shown in FIG. 4. The hollow anode plasma treatment device includes, for example, a treatment roll 7 that functions as a negative electrode. The negative electrode 5 and a shielding plate 11 arranged at each of both ends of the negative electrode 5 are arranged outside the treatment roll 7 so as to be opposed to the treatment roll 7. The negative electrode 5 is formed into a box shape having an opening. The opening of the negative electrode 5 is open so as to confront the treatment roll 7. Each shielding plate 11 has a curved shape which is in conformity with the treatment roll 7. A gas introduction nozzle 9 is arranged above the negative electrode 5 to introduce a gas into a gap between the treatment roll 7 and the negative electrode 5 and between the treatment roll 7 and each shielding plate 11. A matching box 12 is arranged behind the negative electrode 5.

In applying RIE treatment to the OPP base 1 using such a hollow anode plasma treatment device, the OPP base 1 is conveyed over the treatment roll 7, while applying a voltage to the negative electrode 5 from the matching box 12. Thus, plasma 6 is generated in the gaps between the treatment roll 7, and the negative electrode 5 and each shielding plate 11, into which the gas is introduced. Radicals residing in the plasma 6 are attracted to the treatment roll 7 that serves as a positive electrode, and permitted to react on the surface of the OPP base 1. This radicals' action only causes a chemical reaction, and plasma etching is chiefly performed. Therefore, adhesiveness cannot be well improved between the base and the aluminum oxide thin film.

Therefore, the hollow anode plasma treatment device shown in FIG. 4 may be used for forming a film. The hollow anode plasma treatment device has a configuration in which an area (Sa) of the treatment roll 7 functioning as a positive electrode is larger than an area (Sc) of the OPP base 1 that is an electrode to be paired (Sa>Sc). Thus, lots of self-bias can be generated on the OPP base 1. The large self-bias not only causes the chemical reaction mentioned above, but also causes a sputtering effect (physical effect) by which ions 6 in the plasma are attracted to the OPP base 1. Accordingly, when an aluminum oxide thin film is formed on a surface of the OPP base 1 that has been subjected to RIE treatment, adhesiveness can be improved between the OPP base 1 and the aluminum oxide thin film.

In RIE treatment, it is preferable to incorporate a magnet in the hollow anode electrode for use as a magnetically assisted hollow anode. Thus, plasma surface treatment can be performed at high speed in a stronger and more stable manner. With the magnetic field generated from the magnetic electrode, plasma confinement effect is further enhanced, while a high ion current density can be obtained with large self-bias.

Gas species that can be used for performing pretreatment by RIE include, for example, argon, oxygen, nitrogen, or hydrogen. These gases may be used singly or in combination of two or more. In RIE treatment, two or more treatment devices may be used to perform successive treatment. In this case, the two or more treatment devices to be used do not have to be of the same type. For example, the base may be treated by a planar-type treatment device, successively followed by treatment using a hollow anode plasma treatment device.

In the gas barrier laminate 10 according to the first embodiment of the present invention, whichever of the structures shown in FIGS. 1, 2A and 2B may be used, the structure may include still another layer. For example, an aluminum oxide thin film may be formed on the other surface of the OPP base 1 (second surface that is the surface opposite to the first surface) as well.

Figure 2C:
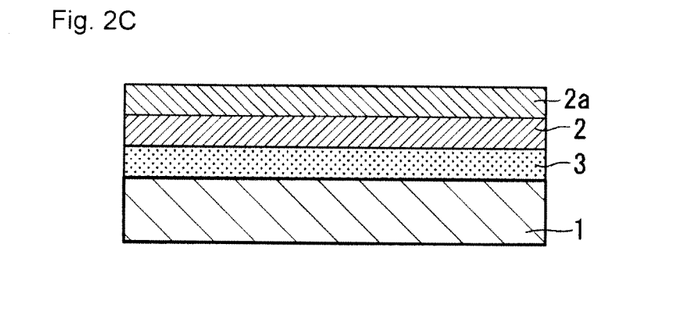
FIG. 2C is a cross-sectional view illustrating a modification of the first embodiment of the gas barrier laminate related to the present invention.

Further, as shown in FIG. 2C, an overcoat layer 2a may be formed on the aluminum oxide thin film 2 to give protection, and improve adhesiveness and printability. The material of the overcoat layer can be selected, for example, from solvent-soluble or water-soluble polyester resins, isocyanate resins, urethane resins, acrylic resins, vinyl alcohol resins, ethylene vinyl alcohol copolymer (EVOH) resins, vinyl-modified resins, epoxy resins, oxazoline group-containing resins, modified styrene resins, modified silicone resins, or alkyl titanate, or the like. The overcoat layer may be configured by a single layer or a laminated layer of two or more, which use these materials.

A filler may be added to the overcoat layer to improve barrier properties, abrasiveness, sliding properties, and the like. As the filler, mention may be made, for example, of a silica sol, alumina sol, particulate inorganic filler, lamellar inorganic filler, or the like. These may be used singly or in combination of two or more. Preferably, the overcoat layer is formed by adding a filler to the resin mentioned above, followed by polymerization or condensation.

In the case of providing an aluminum oxide thin film on only one surface of the OPP base 1, a layer may be provided to the other surface, the layer containing a known additive, such as an antistatic agent, an ultraviolet absorbing agent, a plasticizing agent, or the like.

Taking account of suitability as a packaging material, the gas barrier laminate 10 according to the first embodiment of the present invention may be laminated with another film on one surface of the OPP base 1. Another film that can be used includes, for example, a polyester film such as of polyethylene terephthalate, a nylon film, or a fluorine-based resin film such as a polyvinyl fluoride or polyvinyl fluoride film. Further, a resin film other than the ones mentioned above may be laminated on the OPP base 1 as described above.

Second Embodiment

In a representative second embodiment, components identical with or similar to those in the first embodiment are given the same reference numerals for the sake of omitting or simplifying description.

A gas barrier laminate related to the second embodiment includes, similar to the first embodiment, a base 1 made of a biaxially-oriented polypropylene (OPP) film (OPP base), and an aluminum oxide thin film 2 laminated on at least one surface of the base. In particular, in the biaxially-oriented polypropylene film, an orientation angle measured by phase-contrast measurement is 50° to 90° or −50° to −90° relative to an MD direction.

Figure 5:
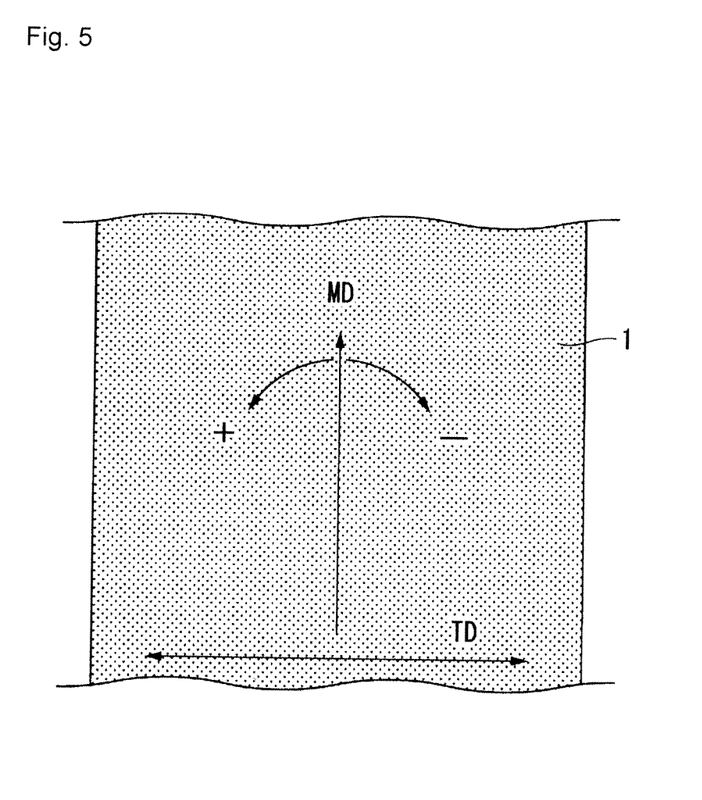
FIG. 5 is an explanatory view showing definition of an orientation angle of an OPP film base, in a second embodiment of the present invention.

As shown in FIG. 5, when molecular chains are arranged being tilted leftward with the MD direction as being 0°, the orientation angle is defined to be +(plus), but when arranged being tilted rightward, defined to be −(minus). In the figure, TD refers to a transvers direction and thus indicates a width direction of the film.

The orientation angle relative to the MD direction can be calculated by phase-contrast measurement using visible light, molecular orientation measurement using microwaves, or the like. However, in the case of molecular orientation measurement using microwaves, the measured values greatly vary depending on the persons who take measurements. In contrast, in the case of phase-contrast measurement, stable measurement can be made, irrespective of the persons who take measurements, or hardly causing variation between the persons who take measurements. Moreover, phase-contrast measurement enables correct measurement of an orientation angle. Accordingly, it is better to use phase-contrast measurement for the measurement of an orientation angle relative to the MD direction.

The inventor of the present invention pursued various researches regarding lowering of adhesiveness in a conventional gas barrier laminate in which an aluminum oxide thin film is laminated on a base made of a resin film. As a result of the researches, it was found that the lowering of a cohesive force in the surface of the film base, on which the aluminum oxide thin film was laminated, was the cause of the lowering of the adhesiveness between the base and the aluminum oxide thin film.

Based on the results of the research, the inventor further investigated the cohesive force on the surface of a base made of an OPP film on which an aluminum oxide thin film was formed. As a result of the further researches, it was found that the lowering of the cohesive force was associated with the orientation angle of the base made of an OPP film relative to the MD direction.

Specifically, usually, after being biaxially oriented, an OPP film is retained at an appropriate heat-setting temperature. As a result, the molecules are regulated so as to be horizontally arrayed relative to the MD direction of the film surface. The angle of orientation of the molecules determines the orientation angle relative to the MD direction. The adhesiveness of the aluminum oxide thin film laminated on a base can be enhanced by using, as a base, an OPP film whose orientation angle measured by phase-contrast measurement ranges from 50° to 90° or −50° to −90° relative to the MD direction. Moreover, such properties can be retained under the conditions of boiling/retort treatment. This is a finding obtained by the inventor of the present invention for the first time.

Referring to FIG. 1, the gas barrier laminate related to the second embodiment of the present invention will be specifically described. FIG. 1 is a schematic cross-sectional view illustrating the gas barrier laminate of the second embodiment. A gas barrier laminate 10 has a structure in which the aluminum oxide thin film 2 is laminated on the OPP film base 1. The "OPP film base 1" described below corresponds to the "base 1" and the "OPP base 1" in the first embodiment described above. However, the OPP film base 1 of the second embodiment has an orientation angle as specified in the following range.

In the OPP film base 1, the orientation angle relative to the MD direction measured by phase-contrast measurement is specified to be 50° to 90° or −50° to −90°. Preferably, the OPP film base 1 is transparent so as not to impair the transparency of the aluminum oxide thin film 2.

As the OPP film base 1, an oriented base having high mechanical strength and excellent dimensional stability is used, similar to the first embodiment. In the second embodiment, the base used for the OPP film base 1 is prepared by performing biaxial orientation, followed by heat setting to ensure that the orientation angle relative to the MD direction falls in the range of 50° to 90° or −50° to −90°. The orientation angle can be controlled by appropriately selecting the conditions for biaxial orientation and heat setting. For example, after biaxial orientation, when the center portion relative to a width direction is used, the orientation angle of the OPP film base 1 can be selected so as to fall within a desired range.

Further, it is preferable that the plane orientation factor $\Delta P$ according to phase-contrast measurement is in a range of 0.005 to 0.020. An appropriate selection of the conditions for biaxial orientation and heat setting can also control the plane orientation factor $\Delta P$. For example, biaxial orientation can be followed by heat setting over a long duration of time at a low temperature. As a result of this, the plane orientation factor $\Delta P$ of the OPP film can be adjusted to a desired range. Use of the OPP film having the plane orientation factor $\Delta P$ ranging from 0.005 to 0.020 as a base can improve the cohesive force and further enhance the adhesiveness relative to the aluminum oxide thin film 2 laminated on the base.

The thickness of the OPP film base 1 to be adopted is similar to the one used in the first embodiment. The thickness of the base is preferably 3 to 200 μm, more preferably 6 to 50 μm.

The aluminum oxide composing the aluminum oxide thin film 2 is substantially similar to the one used in the first embodiment. The aluminum oxide thin film 2 specified to have a thickness of 5 to 300 nm exhibits flexibility appropriate for making uniform the film thickness and appropriate as a gas barrier material. A more preferable thickness of the aluminum oxide thin film 2 is 10 to 100 nm.

As shown in FIG. 2A, the gas barrier laminate 10 according to the second embodiment may have a structure in which a primer layer 3 (anchor coat layer, anchor layer) is formed on a surface of the OPP film base 1, and the aluminum oxide thin film 2 is provided on the primer layer 3. For example, as the primer layer 3, an anchor coat layer may be formed. The primer layer 3 may also be formed by giving a pretreatment, such as reactive ion etching (RIE) treatment, to a surface of the OPP film base 1.

Similar to the first embodiment described above, the anchor coat layer can be formed by coating an anchor coat agent onto a surface of the OPP film base 1, followed by drying. The primer layer 3 formed of the anchor coat layer has an effect of further improving the adhesiveness between the OPP film base 1 and the aluminum oxide thin film 2.

Usually, the anchor coat layer may have a thickness of around 5 nm to 5 μm. The anchor coat layer having such a thickness enables formation of a film with a uniform thickness on a surface of the base, with the internal stress being suppressed. More preferably, the anchor coat layer has a thickness of 10 nm to 1 μm. To improve coating properties and adhesiveness of the anchor coat layer, the base surface may be subjected to discharge treatment, such as RIE treatment or corona treatment, precedent to anchor coating.

On the other hand, when discharge treatment is applied to the base surface in forming the primer layer 3, plasma is used. Radicals or ions generated in plasma can exert a chemical effect of imparting the base surface with a functional group. Further, ion etching can exert a physical effect of removing surface impurities, while increasing surface roughness. As a result, the adhesiveness between the OPP film base 1 and the aluminum oxide thin film 2 can be further improved, thereby providing a structure in which the both are not separated from each other in boil/retort treatment.

Further, the RIE treatment also has an effect of regulating the orientation angle of the OPP film base 1 so as to have a more appropriate value. As described in the first embodiment, RIE treatment can be performed by means of a take-up type in-line device shown in FIG. 3. Alternatively, RIE treatment may be performed by means of the hollow anode plasma treatment device shown in FIG. 4.

The gas barrier laminate related to the second embodiment having any of the structures shown in FIGS. 1, 2A and 2B may further include another layer. For example, the aluminum oxide thin film 2 may also be formed on the other surface of the OPP film base 1.

Similar to the first embodiment described above, the gas barrier laminate 10 related to the second embodiment may be laminated with another film, taking account of suitability as a packaging material.

Third Embodiment

In a representative third embodiment, the components identical with or similar to those in the second embodiment are given the same reference numerals for the sake of omitting or simplifying description.

In a method for producing a gas barrier laminate related to the third embodiment, a selection is made firstly for an OPP film having an orientation angle ranging about from 50° to 90° or −50° to −90° relative to an MD direction, the orientation angle being measured by phase-contrast measurement, and the selected OPP film is used as a base. Alternatively, a region having an orientation angle of the above range may be cut out from a prepared OPP film sheet, for use as a base.

Then, an aluminum oxide thin film 2 is laminated on the OPP film base 1 to produce a gas barrier laminate 10. The aluminum oxide thin film 2 may be laminated, for example, by means of vacuum vapor deposition, sputtering, ion plating, plasma chemical vapor deposition, or the like. Taking account of productivity, vacuum vapor deposition is preferably used.

A method of heating used in the vacuum vapor deposition includes, for example, but is not particularly limited to, an electron beam heating method, a resistance heating method, an induction heating method, or the like. The electron beam heating method or the resistance heating method, which is able to provide a wide variety of selections of vaporized materials, is more favorable.

In the third embodiment, an anchor coat layer, or a primer layer applied with discharge treatment, such as RIE treatment or corona treatment, is allowed to be formed, as in the foregoing second embodiment, precedent to laminating the aluminum oxide thin film 2 on a surface of the base.

In the third embodiment, an overcoat layer is allowed to be formed, as in the above second embodiment, on the aluminum oxide thin film 2. Further, in the third embodiment, the aluminum oxide thin film 2 is also allowed to be laminated on the other surface of the OPP film base 1.

Fourth Embodiment

In a representative fourth embodiment, the components identical with or similar to those in the first and second embodiments are given the same reference numerals for the sake of omitting or simplifying description.

In a method for producing a gas barrier laminate related to the fourth embodiment, a selection is firstly made from among OPP films, for an OPP film having a plane orientation factor ΔP ranging from about 0.005 to about 0.020 according to phase-contrast measurement, and the selected OPP film is used as a base.

From a viewpoint of adhesiveness, it is more preferable to use an OPP film having an orientation angle ranging about from 50° to 90° or −50° to −90° relative to an MD direction measured by phase-contrast measurement. Alternatively, a region having an orientation angle of the above range may be cut out from a prepared OPP film sheet, for use as a base.

Subsequently, an aluminum oxide thin film 2 is laminated on a surface of the OPP film base 1 to produce a gas barrier laminate 10. The aluminum oxide thin film 2 may be laminated, for example, by means of vacuum vapor deposition, sputtering, ion plating, plasma chemical vapor deposition, or the like. Taking account of productivity, vacuum vapor deposition is preferably used.

A method of heating used in the vacuum vapor deposition includes, for example, but is not particularly limited to, an electron beam heating method, a resistance heating method, an induction heating method, or the like. The electron beam heating method or the resistance heating method, which is able to provide a wide variety of selections of vaporized materials, is more favorable.

In the fourth embodiment, an anchor coat layer, or a primer layer applied with discharge treatment, such as RIE treatment or corona treatment, is allowed to be formed as in the foregoing first and second embodiments, prior to laminating the aluminum oxide thin film 2 on a surface of the base.

In the fourth embodiment, an overcoat layer is allowed to be formed, as in the foregoing first and second embodiments, on the aluminum oxide thin film 2. Further, in the fourth embodiment, the aluminum oxide thin film 2 is also allowed to be laminated on the other surface of the OPP film base 1.

Preferred embodiments of the present invention have so far been described. However, these embodiments are only exemplifications of the present invention, and thus should not be construed as limiting the present invention. Additions, omissions, replacements and other modifications may be performed without departing from the scope of the present invention. Accordingly, the present invention should not be construed as being limited by the description provided above but should be limited by the claims.

EXAMPLES

Examples of the present invention are provided below. However, the present invention should not be limited by these examples.

First, Examples 1 to 5 corresponding to the first embodiment of the present invention, and Comparative Examples 1 to 5 will be described.

Example 1

An OPP film (base) having a plane orientation factor $\Delta P$ that was adjusted to 0.011 and having a thickness of 20 μm was prepared by performing biaxial orientation, followed by heat setting treatment. One surface of the base was subjected to gravure coating to apply a coating liquid thereto. The coating liquid in this case was obtained by mixing a composite that contains a silane coupling agent, acrylic polyol and an isocyanate compound, with a solvent. The resultant coated base was heated and dried to form an anchor coat layer made of a urethane-based resin of about 0.3 μm. Then, using an electron beam heating method, an aluminum oxide thin film having an O/Al ratio of 1.2 and having a thickness of about 15 nm was formed.

Then, a solution was prepared by mixing a tetraethoxysilane hydrolysis solution with a polyvinyl alcohol/water/isopropyl alcohol mixed solution. The prepared solution was coated onto the aluminum oxide thin film by means of gravure coating to form an overcoat layer having a thickness of 500 nm. Through the process mentioned above, a gas barrier laminate was prepared.

Using a phase-contrast measurement device (KOBRA-WR manufactured by Oji Scientific Instruments), a phase difference was measured with an incident angle of 0° to 50° (10° pitch) in respect of an area of 40 mm×40 mm of the OPP film to calculate the plane orientation factor $\Delta P$.

The O/Al ratio of the aluminum oxide thin film was obtained using an X-ray photoelectron spectral analysis device (JPS-90MXV manufactured by JEOL Ltd.) according to X-ray photoelectron spectroscopy (XPS). Specifically, as an X-ray source, a non-monochromatized Mg Kα (1253.6 eV) source was used to perform measurement with an X-ray output of 100 W (10 kV to 10 mA). For quantitative analysis for obtaining the O/Al ratio, relative sensitivity factors of 2.28 for O1s and 0.6 for Al2p, respectively, were used.

Example 2

Excepting that the plane orientation factor $\Delta P$ was 0.012 and the O/Al was 1.3, a gas barrier laminate was prepared under the conditions similar to those of Example 1.

Example 3

An OPP film whose plane orientation factor $\Delta P$ was adjusted to 0.013 was subjected to RIE treatment using a nitrogen gas, followed by forming an aluminum oxide thin film having an O/Al ratio of 1.5. Besides this, a gas barrier laminate was prepared under the conditions similar to those of Example 1.

Example 4

An OPP film whose plane orientation factor $\Delta P$ was adjusted to 0.009 was subjected to RIE treatment using an argon gas, followed by forming an aluminum oxide thin film having an O/Al ratio of 1.0. Besides this, a gas barrier laminate was prepared under conditions similar to those of Example 1.

Example 5

An OPP film whose plane orientation factor $\Delta P$ was adjusted to 0.010 was provided with a polyester resin-based anchor coat layer having a thickness of 1 μm, followed by forming an aluminum oxide thin film having an O/Al ratio of 1.4. Besides this, a gas barrier laminate was prepared under conditions similar to those of Example 1.

Comparative Example 1

Excepting that the plane orientation factor $\Delta P$ was 0.021 and the O/Al ratio was 1.7, a gas barrier laminate was prepared under conditions similar to those of Example 1.

Comparative Example 2

Excepting that the plane orientation factor $\Delta P$ was 0.025 and the O/Al ratio was 1.8, a gas barrier laminate was prepared under conditions similar to those of Example 1.

Comparative Example 3

Excepting that the plane orientation factor $\Delta P$ was 0.030 and the O/Al ratio was 0.9, a gas barrier laminate was prepared under conditions similar to those of Example 1.

Comparative Example 4

Excepting that the plane orientation factor $\Delta P$ was 0.023 and the O/Al ratio was 1.0, a gas barrier laminate was prepared under the conditions of Example 1.

Comparative Example 5

Excepting that the plane orientation factor $\Delta P$ was 0.026 and the O/Al ratio was 1.4, a gas barrier laminate was prepared under the conditions of Example 1.

<Evaluation>

For the gas barrier laminates obtained in Examples 1 to 5 and Comparative Examples 1 to 5, peeling strength was measured using the following method. The results of the measurement are shown in the following Table 1.

A nylon film having a thickness of 15 μm and a non-oriented polypropylene film were laminated on a vapor deposition surface of each of the above gas barrier laminates by means of a urethane-based adhesive to thereby obtain a laminated structure. The adhered OPP film was peeled from the aluminum oxide thin film at the interface therebetween to provide an opportunity (peeling start portion) to thereby measure a peeling strength. As a tensile tester, Tensilon RTC-1250 manufactured by Orientec Co., Ltd., was used, and peeling strength was measured when peeling as at 180°. It should be noted that a peeling strength of 2N/15 mm or more was determined to be an acceptable level (O), while that of less than 2N/15 mm was determined not to be an acceptable level (X).

TABLE 1

| | Plane orientation factor (ΔP) | O/Al | Peeling strength [N/15 mm] | Evaluation |
|---|---|---|---|---|
| Example 1 | 0.011 | 1.2 | 3.0 | O |
| Example 2 | 0.012 | 1.3 | 2.9 | O |
| Example 3 | 0.013 | 1.5 | 2.8 | O |
| Example 4 | 0.009 | 1.0 | 3.5 | O |
| Example 5 | 0.010 | 1.4 | 3.2 | O |
| Comparative Example 1 | 0.021 | 1.7 | 0.5 | X |
| Comparative Example 2 | 0.025 | 1.8 | 0.3 | X |
| Comparative Example 3 | 0.030 | 0.9 | 0.2 | X |
| Comparative Example 4 | 0.023 | 1.0 | 0.4 | X |
| Comparative Example 5 | 0.026 | 1.4 | 0.2 | X |

<Results of Comparison>

The products of the present invention obtained from Examples 1 to 5 each showed a peeling strength of 2.8 N/15 mm or more (maximum of 3.5 N/15 mm), or showed a high adhesiveness between the base and the aluminum oxide thin film which ensured that the products had an adhesion strength that could well endure boil/retort treatment. On the other hand, Comparative Examples 1 to 5 each exhibited a peeling strength of 0.2 to 0.5 N/15 mm which was far from the acceptable level of 2N/15 mm.

The following description deals with Examples 6 to 10 corresponding to the second embodiment of the present invention and Comparative Examples 6 to 10.

First, ten types of OPP films (bases) each having a thickness of 20 μm were prepared. Of the ten types of OPP films, the ones having a plane orientation factor of 0.023 and 0.026 were used in Examples 8 and 9. In Examples 8 and 9, these OPP films were each subjected to RIE treatment to form an RIE treatment layer (surface-treated layer). For each of the bases, a phase difference was measured to calculate an orientation angle and a plane orientation factor. In other words, using a phase-contrast measurement device (KOBRA-WR manufactured by Oji Scientific Instruments), a phase difference was measured with an incident angle of 0° to 50° (10° pitch) in respect of an area of 40 mm×40 mm of the OPP film. The following Table 2 shows orientation angles relative to an MD direction, and plane orientation factors of eight types of OPP films subjected to measurement. It should be noted that the plane orientation factor of each of Examples 8 and 9 is a value measured on a surface of the RIE treatment layer.

Subsequently, one surface of each base was subjected to gravure coating to apply a coating liquid thereto. The coating liquid in this case was obtained by mixing a composite that contains a silane coupling agent, acrylic polyol and an isocyanate compound, with a solvent. The resultant coated base was heated and dried to form an anchor coat layer made of a urethane-based resin of about 0.3 μm. Then, using an electron beam heating method, aluminum oxide was vapor-deposited to laminate a thin film of 15 nm thick on one surface of each of the OPP films to produce samples of eight types of gas barrier laminates.

For each of the obtained samples, an O/Al ratio in the aluminum oxide thin film was obtained by using X-ray photoelectron spectroscopy (XPS). As a measurement device, an X-ray photoelectron spectral analysis device (JPS-90MXV manufactured by JEOL Ltd.) was used. As an X-ray source, a non-monochromatized MgKα (1253.6 eV) was used to perform measurement with an X-ray output of 100 W (10 kV to 10 mA). For quantitative analysis for obtaining O/Al ratio, relative sensitivity factors of 2.28 for O1s and 0.6 for Al2p, respectively, were used. The O/Al ratios of the eight types of samples are shown in Table 2.

Further, for each sample, a peeling strength was examined by means of the following method. A nylon film (ONy) having a thickness of 15 μm and non-oriented polypropylene (CPP) were laminated on a vapor deposition surface of each of the gas barrier laminate samples by means of a urethane-based adhesive to thereby obtain a laminated structure. The adhered OPP film was peeled from the aluminum oxide thin film at the interface therebetween to provide an opportunity (peeling start portion), thereby measuring a peeling strength. As a tensile tester, Tensilon RTC-1250 manufactured by Orientec Co., Ltd. was used, and a peeling strength was measured when peeling was at 180. The results are shown in Table 2. It should be noted that, in the evaluation shown in Table 2, a peeling strength of 2N/15 mm or more was determined to be an acceptable level (O), while that of less than 2N/15 mm was determined not to be an acceptable level (X).

TABLE 2

| | Plane orientation factor | Orientation angle [°] | O/Al | Peeling strength [N/15 mm] | Evaluation |
|---|---|---|---|---|---|
| Example 6 | 0.011 | 87.2 | 1.3 | 3.1 | O |
| Example 7 | 0.012 | 82.6 | 1.2 | 3.0 | O |
| Example 8 | 0.013 | −78.3 | 1.4 | 2.8 | O |
| Example 9 | 0.009 | 75.4 | 1.1 | 2.7 | O |
| Example 10 | 0.010 | −62.6 | 1.4 | 2.3 | O |
| Comparative Example 6 | 0.021 | 45.2 | 1.8 | 0.4 | X |
| Comparative Example 7 | 0.025 | 38.6 | 1.9 | 0.2 | X |
| Comparative Example 8 | 0.030 | −28.5 | 0.9 | 0.1 | X |
| Comparative Example 9 | 0.023 | 45.6 | 1.6 | 0.1 | X |
| Comparative Example 10 | 0.026 | −45.7 | 0.8 | 0.2 | X |

As is apparent from Table 2, in Comparative Example 6 in which an OPP film having an orientation angle of 45.2° was used as a base, the peeling strength is 0.5 N/15 mm which is out of the range of the acceptable level. Similarly, in Comparative Example 7 in which an OPP film having an orientation angle of 38.6° was used as a base, the peeling strength is 0.3 N/15 mm which is out of the range of the acceptable level. Further, in Comparative Example 8 in which an OPP film having an orientation angle of −28.5° was used as a base, the peeling strength is 0.2 N/15 mm which is out of the range of the acceptable level. Similarly, in Comparative Examples 9 and 10 in which IRE treatment was not performed, the orientation angles are 45.6° and −45.7°, respectively, and the peeling strengths are 0.2 N/15 mm and 0.3 N/15 mm, respectively, which are out of the acceptable range. The effect of RIE treatment can be seen. In this way, it will be understood that Comparative Examples 6 to 8, in each of which an OPP film having an orientation angle of 0° to 50° or 0° to −50° was used, cannot provide a gas barrier laminate having a desired adhesiveness.

In contrast, any of Examples 6 to 10 in each of which a PET film having an orientation angle of 50° to 90° or −50° to −90° measured by phase-contrast measurement was used as a base, exhibits a peeling strength of 2.2 N/15 mm or more, or 3.2 N/15 mm at the maximum. Thus, it will be understood that a high adhesiveness can be imparted between the base and the aluminum oxide thin film.

As described above, use of an OPP film whose orientation angle relative to an MD direction is specified to fall within a predetermined range according to a phase-contrast method can provide a gas barrier laminate whose adhesiveness is hardly lowered when subjected not only to unheated treatment but alto to boiling/retort treatment. The present invention can provide a gas barrier laminate for use as a packaging material for food products, precision electronic components, or pharmaceutical products, and a method for producing the gas barrier laminate.

INDUSTRIAL APPLICABILITY

The present invention can be provided as a packaging material for food products, precision electronic components, or pharmaceutical products, and as a gas barrier laminate that can cope with boil/retort treatment.

REFERENCE SIGNS LIST

1 . . . OPP base (OPP film base)
2 . . . Aluminum oxide thin film
3 . . . Anchor coat layer (primer layer)
4 . . . Surface-treated layer
5 . . . Electrode (negative electrode)
6 . . . Plasma (ions in plasma)
9 . . . Gas introduction nozzle (gas introduction port)
10 . . . Shielding plate
12 . . . Matching box

What is claimed is:
1. A gas barrier laminate comprising:
a base comprising a biaxially-oriented polypropylene film and an anchor coat layer; and
an aluminum oxide thin film adhered to at least one surface of the base, wherein:
the aluminum oxide thin film is adhered to the anchor coat layer;
the anchor coat layer comprises a material selected from a polyester resin, a urethane resin, an acrylic resin, and an oxazoline group-containing resin; and
the biaxially-oriented polypropylene film has a molecular chain whose orientation angle measured by phase-contrast measurement ranges about from 50° to 90° or −50° to −90° relative to an MD direction, and has a plane orientation factor ΔP ranging from about 0.005 to about 0.020 according to phase-contrast measurement.
2. The gas barrier laminate of claim 1, wherein the aluminum oxide thin film has a ratio of oxygen and aluminum (O/Al) ranging from about 1.0 to about 1.5 as measured by X-ray photoelectron spectroscopy.
3. The gas barrier laminate of claim 1, wherein the aluminum oxide thin film has a thickness of about 10 to about 300 nm.
4. A method for producing a gas barrier laminate comprising:
selecting as a base a biaxially-oriented polypropylene film having a molecular chain whose orientation angle measured by phase-contrast measurement ranges about from 50° to 90° or −50° to −90° relative to an MD direction, and having a plane orientation factor ΔP ranging from about 0.005 to about 0.020 according to phase-contrast measurement; and
laminating an aluminum oxide thin film at least on one surface of the base.
5. A method for producing a gas barrier laminate comprising:
preparing a base by applying reactive ion etching to a biaxially-oriented polypropylene film to control an orientation angle of molecular chain measured by phase-contrast measurement to a range of about from 50° to 90° or −50° to −90° relative to an MD direction, and control a plane orientation factor ΔP to a range of about 0.005 to about 0.020 according to phase-contrast measurement; and
laminating an aluminum oxide thin film at least on one surface of the base.
6. The gas barrier laminate of claim 1, wherein the base consists of the biaxially-oriented polypropylene film and the anchor coat layer.
7. A gas barrier laminate comprising:
a base consisting of a biaxially-oriented polypropylene film and a surface-treated layer formed by discharge treatment; and
an aluminum oxide thin film adhered to at least one surface of the base, wherein:
the aluminum oxide thin film is adhered to the surface treated layer; and
the biaxially-oriented polypropylene film has a molecular chain whose orientation angle measured by phase-contrast measurement ranges about from 50° to 90° or −50° to −90° relative to an MD direction, and has a plane orientation factor ΔP ranging from about 0.005 to about 0.020 according to phase-contrast measurement.

* * * * *